United States Patent [19]
Goto et al.

[11] Patent Number: 5,741,360
[45] Date of Patent: Apr. 21, 1998

[54] METHOD OF GROWING A CRYSTAL OF A COMPOUND SEMICONDUCTOR AT A LOW TEMPERATURE

[75] Inventors: Shigeo Goto; Yasuhiko Nomura, both of Ibaraki; Yoshitaka Morishita, Tokyo; Seikoh Yoshida, Ibaraki; Masahiro Sasaki, Kanagawa, all of Japan

[73] Assignee: Optoelectronics Technology Research Corporation, Tokyo, Japan

[21] Appl. No.: 514,229

[22] Filed: Aug. 11, 1995

[30] Foreign Application Priority Data

Aug. 12, 1994 [JP] Japan ................................ 6-190666
Aug. 23, 1994 [JP] Japan ................................ 6-198337

[51] Int. Cl.$^6$ .................................................. C30B 23/04
[52] U.S. Cl. .......................... 117/94; 117/103; 117/104; 117/106; 117/108; 117/913; 117/923
[58] Field of Search ........................... 117/94, 103, 104, 117/106, 108, 913, 923

[56] References Cited

U.S. PATENT DOCUMENTS

4,636,268  1/1987  Tsang ................................ 117/103
5,124,278  6/1992  Bohling et al. ................... 117/103

FOREIGN PATENT DOCUMENTS

5-326545  12/1993  Japan ............................... 117/104

OTHER PUBLICATIONS

Zimmermann et al. "Amino-arsine and Phosphine Compounds for the MOVPE of III-V Semiconductors", Jounel of Crystal Growth, vol. 129, pp. 37–44, 1993.

Hidaka et al., "Low Temperature Selective Epitaxial Growth of GaAs using triethylgallium and Amino-As in Molecular Beam Epitaxy", Japanese Journel of Applied Physics, Part 1 vol. 33 6a, pp. 3500–3504 abs only, Jun. 1994.

Primary Examiner—Robert Kunemund
Attorney, Agent, or Firm—Sughrue, Mion, Zinn, Macpeak, PLLC

[57] ABSTRACT

In a method of selectively growing a crystal of a compound semiconductor layer which is composed of gallium and arsenic, a selective growth is selectively carried out on a substrate by using a combination of metallic gallium and a reactive gas, such as trisdimethylminoarsine, which includes a metallic compound of arsenic specified by at least one amine. The combination may includes organometallic gallium, such as trimethylgallium, triethylgallium instead of the metallic gallium. Such a combination serves to selectively deposit the compound semiconductor layer only on an exposed portion uncovered with a mask. Any other compound semiconductor layer may be selectively deposited on the exposed portion. The exposed portion may be composed of GaAs, AlGaAs, or InGaAs.

14 Claims, 6 Drawing Sheets

1

METHOD OF GROWING A CRYSTAL OF A COMPOUND SEMICONDUCTOR AT A LOW TEMPERATURE

BACKGROUND OF THE INVENTION

This invention relates to a method of selectively growing a crystal of a compound semiconductor.

In general, it has been known in the art that molecular beam epitaxy (MBE) is effective to deposit an epitaxial growth layer of a compound semiconductor, such as GaAs, on a substrate.

In conventional molecular beam epitaxy, various combinations of materials have been used for forming such a compound semiconductor epitaxial layer. Herein, let a gallium arsenide (GaAs) layer be deposited as the compound semiconductor epitaxial layer on a gallium arsenide substrate. In this event, such gallium arsenide epitaxial layers can be deposited by the use of, for example, a combination of solid-state gallium and solid-state arsenic, a combination of solid-state gallium and arsine ($AsH_3$), a combination of trimethylgallium (TMG) and solid-state arsenic, and a combination of trimethylgallium and arsine. Triethylgallium (TEG) may be also used in the molecular beam epitaxy instead of the trimethylgallium. Herein, the solid-state gallium and the solid-state arsenic may be referred to as metallic gallium and metallic arsenic while trimethylgallium and triethylgallium may be collectively called organometallic gallium.

Recent interests have been directed to selective growth of a compound semiconductor by the use of the molecular beam epitaxy as mentioned above. In this event, the selective growth must be progressive only within an exposed area of a substrate which is defined by a mask and must not be progressive on the mask.

Although the metallic gallium and/or the metallic arsenic may be suitable for depositing a pure gallium arsenide epitaxial layer on a whole of a substrate, such use of metallic gallium and metallic arsenic is not suitable for selective growth of a gallium arsenide epitaxial layer because a substrate should be heated to a high temperature, such as 700° C. Otherwise, a gallium arsenide layer is also deposited on the mask.

Alternatively, use of the organometallic gallium can make it possible to achieve selective growth of a gallium arsenide layer on a substrate at a low temperature, such as 450° C. However, high concentration of carbon incorporation into a gallium arsenide layer is a serious problem in the case using organometallic gallium. It may be preferable that a concentration of carbon atoms included in the gallium arsenide epitaxial layer is as small as possible in view of purity of the gallium arsenide epitaxial layer.

SUMMARY OF THE INVENTION

It is therefore an object of this invention to provide a method which can deposit a compound semiconductor epitaxial layer at a low temperature.

It is another object of this invention to provide a method of selectively depositing the compound semiconductor epitaxial layer on a substrate.

It is still another object of this invention to provide a method of the type described, which is capable of carrying out selective growth of a pure compound semiconductor epitaxial layer.

A method to which this invention is applicable is for use in selectively growing a compound semiconductor which includes first and second elements. According to an aspect of this invention, the method comprises the steps of preparing a substrate member which has a first portion covered with a mask and a second portion uncovered with the mask, preparing a solid-state material formed by the first element, together with a reactive gas which includes a compound of the second element and at least one of amines bonded to the second element, and selectively depositing the compound semiconductor only on the second portion of the substrate without deposition of the compound semiconductor on the first portion, by using the reactive gas and the solid-state material.

According to another aspect of this invention, the method comprises the steps of preparing a semiconductor member substrate which has a first portion covered with a mask and a second portion uncovered with the mask, preparing an organometallic material of the first element together with a compound of the second element which includes an amino group bonded to the second element, selectively depositing the compound semiconductor only on the second portion without substantial deposition of the compound semiconductor by using the organometallic material and the compound of the second element.

DESCRIPTION OF THE PREFERRED EMBODIMENTS

Figure 1:
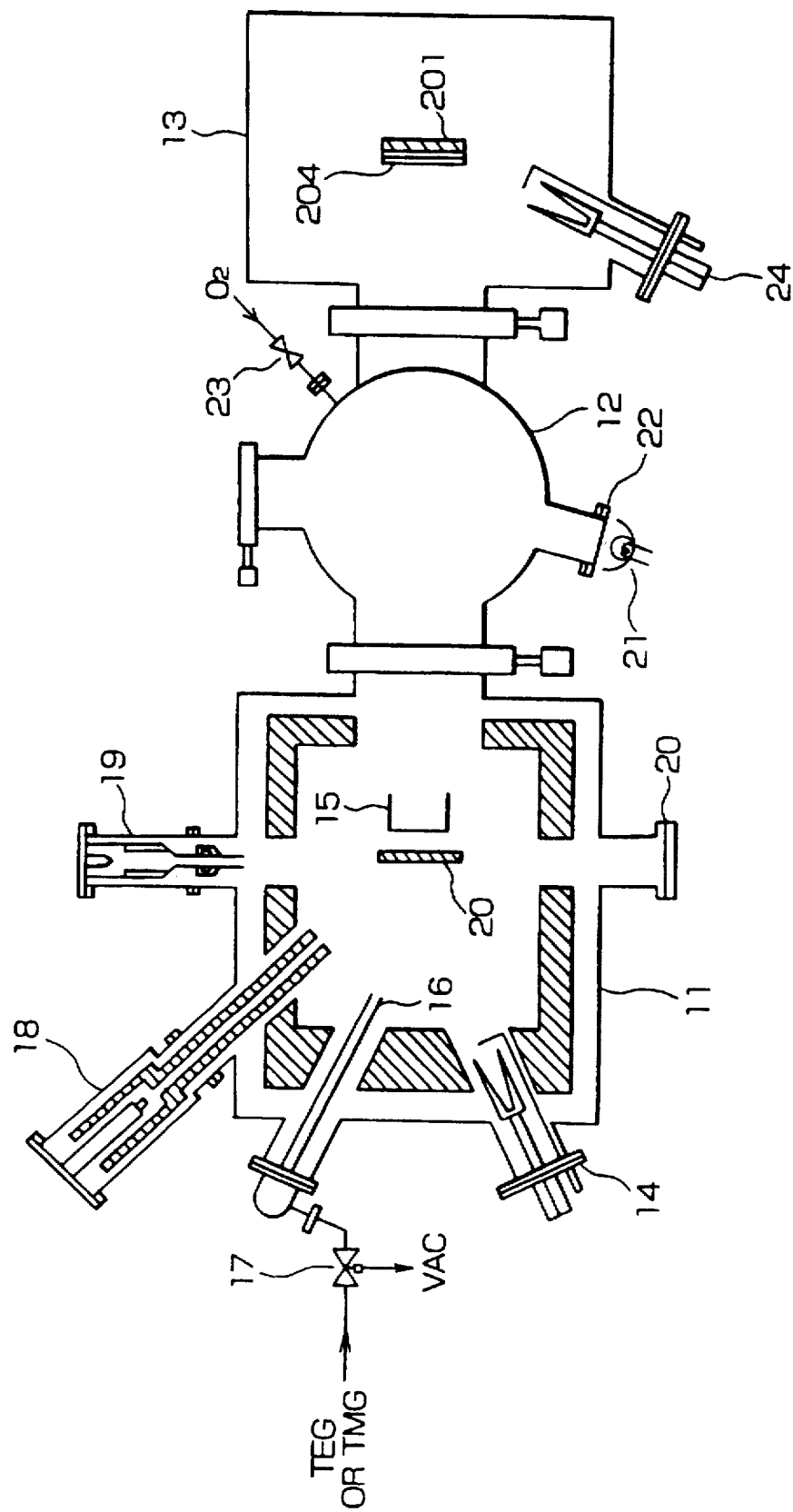
FIG. 1 shows a selective growth system which is used for a method according to a first embodiment of this invention.

Referring to FIG. 1, description will be made as regards a selective growth system which is available for a method according to this invention.

In FIG. 1, the selective growth system comprises a growth chamber 11 which is used for growing a crystal of a compound semiconductor, such as gallium arsenide. A surface treatment chamber 12 is coupled to the growth chamber 11 through a gate valve (unnumbered) and is used for treating a surface of a semiconductor substrate. A patterning chamber 13 is also coupled to the surface treatment chamber 12 to pattern the semiconductor substrate and/or a mask.

As the growth chamber 11, an arsenic (As) cell (Knudsen cell) 14 is attached to the growth chamber 11 as an effusion cell to emit an arsenide molecule beam toward a heater 15 located within the growth chamber 11. In the arsenic cell 14, trisdimethylaminoarsine, namely, $As(N(CH_3)_2)_3$ which will be abbreviated to TDMAAs hereinunder is housed in the form of a liquid as organometallic arsenic which includes arsenic and at least one amino group bonded to the arsenic. At any rate, the TDMAAs may be referred to as an arsenic compound having at least one amino group or an arsenic amino compound.

In addition, a gas nozzle 16 is also attached to the growth chamber 11 and is coupled to a gas source (not shown)

through a variable leak valve 17. Through the gas nozzle 16, triethylgallium (TEG) or trimethylgallium (TMG) is introduced in the form of a gas into the growth chamber 16 and may be directed towards the heater 15. Such triethylgallium or triethylgallium may be called an organometallic compound of gallium. A quadrupole mass spectrometer (QMS) 18, a reflection high energy electron diffraction (RHEED) gun 19, and a fluorescent screen 20 are also attached to the illustrated growth chamber 11 and are operable in a manner to be described later.

A halogen lamp 21 is located outside of the surface treatment chamber 12 and faced to a window 22 of the surface treatment chamber 12. A gas introduction valve 23 is coupled to the surface treatment chamber 12.

As the patterning chamber 13, a gallium (Ga) cell (Knudsen cell) 24 is attached to deposit a gallium layer within the patterning chamber 13. In the illustrated example, a solid-state, namely, a metallic gallium is accommodated within the gallium cell.

Referring to FIGS. 2(A) to (F) together with FIG. 1, a method according to a first embodiment of this invention is for selectively growing a compound semiconductor layer which includes a plurality of elements. In this embodiment, it is assumed that a gallium arsenide (GaAs) epitaxial layer is deposited as the compound semiconductor layer. In this event, gallium (Ga) and arsenic (As) will be called first and second elements.

To this end, a gallium arsenide (GaAs) (100) substrate 201 (will be simply called a substrate hereinunder) is prepared and is at first introduced into the growth chamber 11. In the illustrated example, the substrate 201 is adjacent to the heater 15 in the growth chamber 11. Subsequently, the growth chamber 11 is evacuated by a vacuum pump (not shown). Under the circumstances, the substrate 201 is heated to a temperature range between 610° C. and 630° C. by the heater 15 to remove pollutants or contamination from a surface of the substrate 201.

Figure 2A:
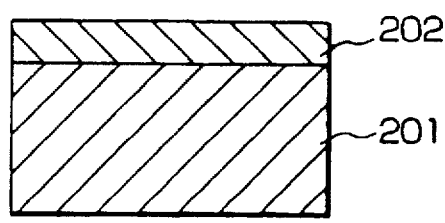
FIGS. 2(A) to (F) show sectional views for use in describing steps of a method according to a first embodiment of this invention.

After the temperature of the substrate 201 is reduced to 580° C., the gas nozzle 16 is opened and the arsenic cell 14 is ignited to introduce the gas of the TEG into the growth chamber 11 and to emit the arsenic molecular beam. As a result, the surface of the substrate 201 are exposed to or irradiated by the TEG gas and the arsenic molecular beam which are sent from the gas nozzle 16 and the arsenic cell 14, respectively. Thus, a GaAs buffer layer 202 is formed on the surface of the substrate 201, as illustrated in FIG. 2(A). After formation of the GaAs buffer layer 202, the temperature of the growth chamber 11 is cooled down to the room temperature.

In FIG. 1, the substrate 201 which has the buffer layer 202 is transferred or transported from the growth chamber 11 to the surface treatment chamber 12 by a transfer device (not shown). An oxygen gas is introduced through the gas introduction valve 23 into the surface treatment chamber 12 which is kept at a pressure of 10 torrs. After the substrate 201 as shown in FIG. 2(A) is transported into the surface treatment chamber 12, the buffer layer 202 is irradiated by the halogen lamp 21 to be exposed to a light beam emitted from the halogen lamp 21 through the window 22. Such exposure lasts for 15 minutes. Consequently, a GaAs oxide film 203 is formed on the buffer layer 202, as shown in FIG. 2(B), and may be called a photooxidation film.

Figure 2B:
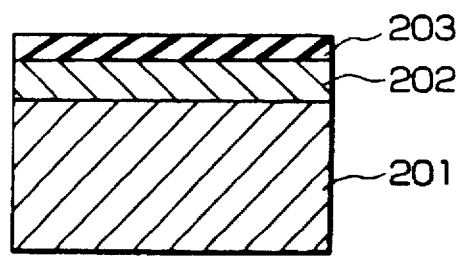
Figure 2C:
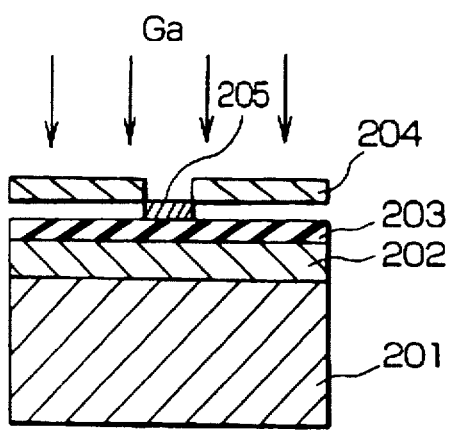
Figure 2D:
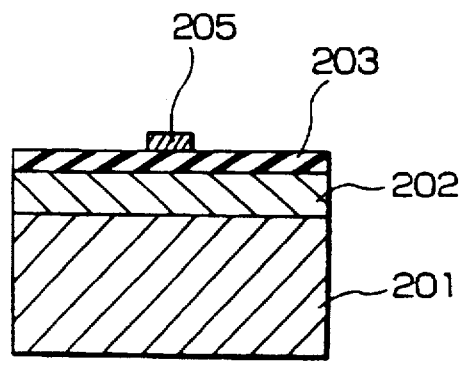

Thereafter, the substrate 201 on which the buffer layer 202 and the GaAs oxide film 203 are formed, as shown in FIG. 2(B) is transferred from the surface treatment chamber 12 to the mask patterning chamber 13 by the transfer device. A metal mask 204 is positioned over the surface of the GaAs oxide film 203 within the mask patterning chamber 13. Under the circumstances, e Ga beam is emitted from the gallium cell 24 and arrives onto the surface of the GaAs oxide film 203 through the metal mask 204, as shown FIG. 2(C). As a result, a Ga layer 205 is locally left on the GaAs oxide film 203, as illustrated in FIG. 2(D). Incidentally, the illustrated Ga layer 205 is composed of fifteen (15) monolayers.

Figure 2E:
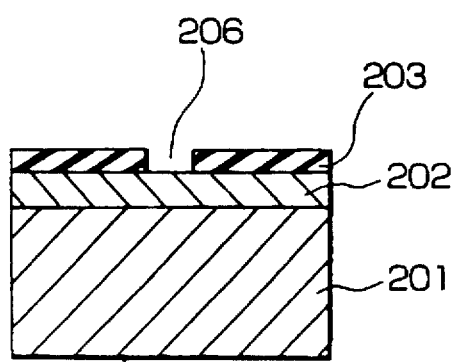

The substrate 201 having the Ga layer 205 is returned from the mask patterning chamber 13 to the growth chamber 11 by the transfer device. The substrate 201 illustrated in FIG. 2(D) is heated by the heater 15 in order that a temperature of the substrate 201 may be increased until 540° C. at a temperature rate of 60° C. per minute. In this event, the GaAs oxide film 203 is partly peeled off together with the Ga layer 205, as shown in FIG. 2(E). In other words, the GaAs oxide film 203 is selectively removed only at a portion covered with the Ga layer 205. As a result, an opening 206 is formed at the GaAs oxide film 203.

It has been confirmed by the QMS 18 that the GaAs oxide film 203 can be peeled off at the substrate temperature of 540° C. together with the Ga layer 205 of about 15 monolayers.

The GaAs oxide film 203 having the opening 205 is used as a mask in a selective growth process which will be described hereinunder. Herein, a combination of the substrate 201, the Ga layer 202, and the mask 203 may be called a substrate member which has a first portion covered with the mask 203 and a second portion uncovered with the mask 203.

Figure 2F:
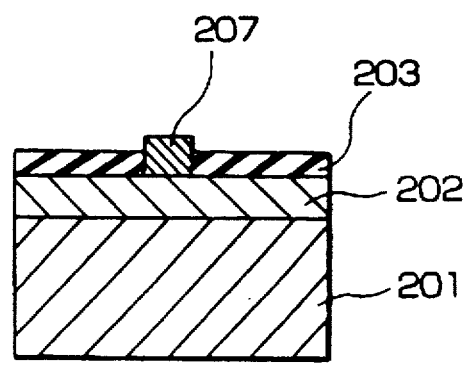

In the selective growth process, the TMG and the tris-dimethylaminoarsine $(As[N(CH_3)_2]_3$: TDMAAs) are sent through the gas nozzle 16 and the arsenic cell 14 into the growth chamber 11 and are irradiated onto a substrate member as shown in FIG. 2(E). Consequently, a GaAs layer 207 is deposited only on the buffer layer 202 exposed by the opening 206 as depicted in FIG. 2(F). In other words, it has been found out that no GaAs layer 207 is deposited on the GaAs oxide film 203 on the condition that the TDMAAs is coexistent with the TMG. In this selective growth process, the TMG is kept at a pressure of $1.0 \times 10^{-7}$ torrs while the TDMAAs is kept at a pressure of $1.5 \times 10^{-7}$ torrs.

According to the inventors' experiments, it has been found out that the GaAs layer 207 is formed only in the opening 206 but the opening 206 is widened, if the GaAs (100) substrate 201 is kept at 450° C. during the selective growth process. On the other hand, the GaAs layer 207 is selectively deposited only in the opening 206 without expansion of the opening 206 when the substrate 201 is kept at a temperature which is not higher than 420° C.

As a result of the experiments, it has been concluded that the GaAs layer 207 is selectively deposited only in the opening 206 under the coexistence of the TMG and the TDMAAs when the substrate 201 is kept at a temperature range between 450° C. and 360° C., preferably between 420° C. and 360° C. In other words, the organometallic gallium and the arsenic amino compound can be used for the selective growth process of the GaAs layer 207.

In the selective growth process, the TEG is used also in place of the TMG.

As a result of the SIMS analysis, it has been confirmed that a concentration of carbon in the GaAs layer 207 is lower than $2 \times 10^{17}$ cm$^{-3}$. This means that the concentration of carbon can be remarkably reduced within the GaAs layer 207 deposited by the abovementioned selective growth.

A gallium nitride (GaN) film may be used as the mask on the selective growth, in place of the GaAs oxide film 203.

The selective growth process is applicable to selective growth of a GaAs film formed by the use of metal organic chemical vapor deposition (MOCVD).

The selective growth process is effective to reduce concentrations of carbon included in other layers of GaAs groups, such as a GaAlAs layer, InGaAs layer, and etc. In this case, arsenic amino compound, organometallic gallium, organometallic aluminum, and organometallic indium may be selectively combined with one another.

Referring to FIG. 3, description will be made as regards a method according to a second embodiment of this invention. The method can be executed by the use of a selective growth system as illustrated in FIG. 1, although not explicitly mentioned in connection with this embodiment. At first, a gallium arsenide (GaAs) (001) substrate 301 (will be simply called a substrate) is prepared and introduced into the growth system. A silicon dioxide film is deposited on a surface of the substrate 301 by chemical vapor deposition. The silicon dioxide film has a thickness of 200 nm. The silicon dioxide film is patterned or etched into silicon dioxide stripes 302 (FIG. 3(A)) by a photolithography technique by the use of hydrogen fluoride. Each of the silicon dioxide stripes 302 is 1 micrometer wide and is distant by 1 micrometer from an adjoining one of the silicon dioxide stripes. This shows that a spacing between two adjacent ones of the silicon dioxide stripes 302 is equal to 1 micrometer. Herein, the substrate 301 which has the etched silicon dioxide stripes 302 may be referred to as a substrate member. In this event, the substrate member provides a first portion covered with the silicon dioxide stripes 302 and a second portion uncovered with the silicon dioxide stripes 302.

After the silicon dioxide film is etched or patterned, the substrate member is washed or cleaned by an organic solvent and a sulfuric acid. Thereafter, the substrate member is mounted on a molecular beam epitaxy device (not shown). In this situation, a gas of the TDMAAs is irradiated onto the surfaces of the substrate 301 and the silicon dioxide stripes 302. The TDMAAs may be considered as a species of arsenic amino compounds and is kept at a pressure of $2.2 \times 10^{-5}$ Torrs. In this event, the substrate 301 is heated to a temperature of 600° C.

Under the circumstances, a beam of gallium atoms is irradiated onto the substrate 301 from a Knudsen cell.

The gallium atoms reach the surface of the silicon dioxide stripes 302 and react on the surface of the silicon dioxide stripes 302 with activators which result from resolution of the TDMAAs. In this event, the gallium atoms reevaporate on the silicon dioxide stripes 302, as illustrated on the lefthand side of FIG. 3(B) and, as a result, no GaAs layer is deposited on the silicon dioxide stripes 302.

Figure 3A:
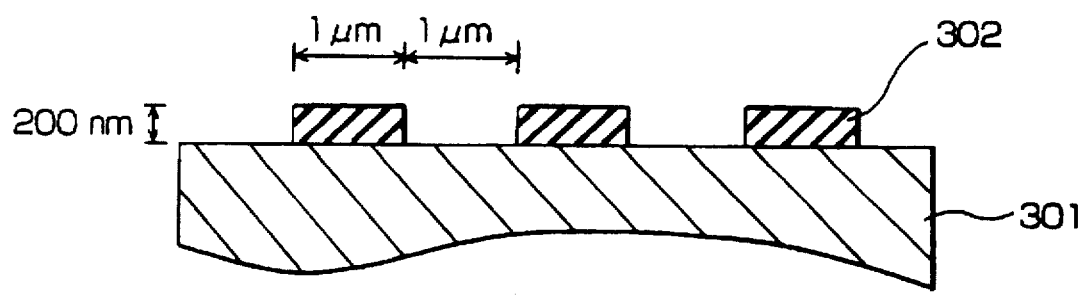
FIGS. 3(A) to (D) show sectional views for use in describing steps of a method according to a second embodiment of this invention.
Figure 3B:
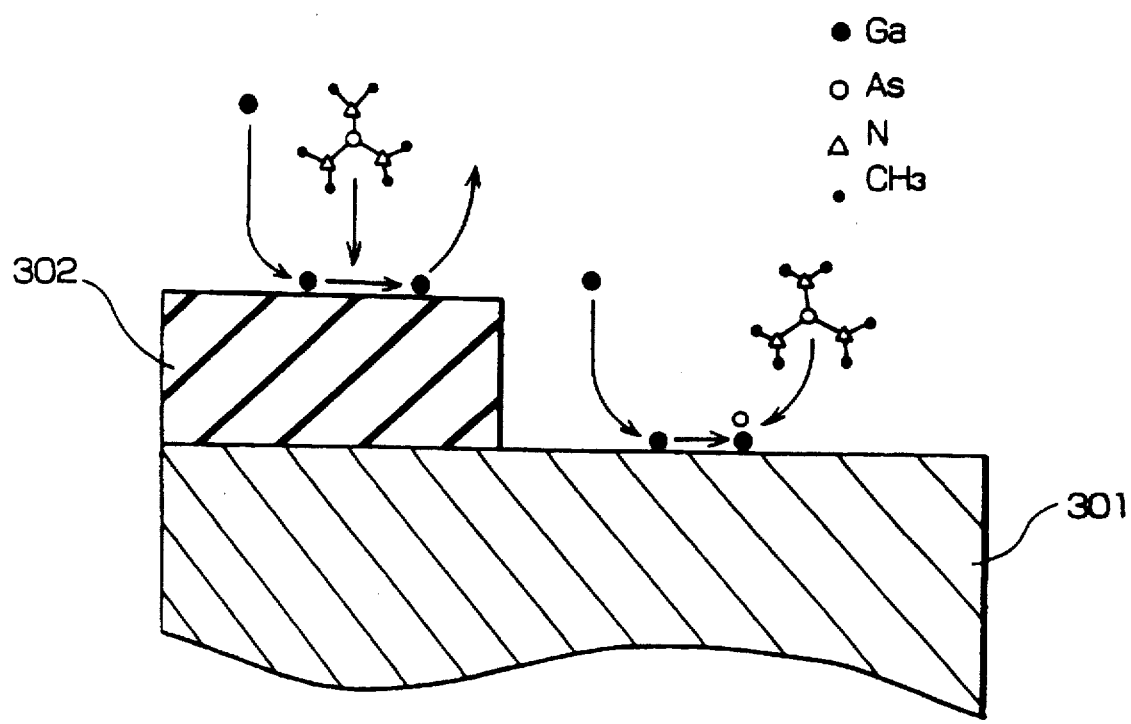
Figure 3C:
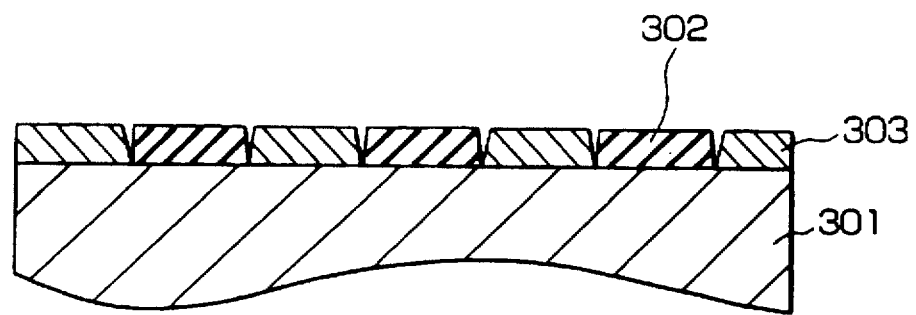

On the other hand, the gallium atoms reach the surface of the GaAs substrate 301 exposed to the gallium atoms and mostly react with arsenic of the TDMAAs, as depicted on the righthand side of FIG. 3(B). Thus, GaAs layers 303 are selectively deposited only on the substrate 301 at a growth rate of 0.3 molecular layer per second, as shown in FIG. 3(C). This means that the silicon dioxide stripes 203 serve as masks. The illustrated GaAs layers 303 have a P-type conductivity ($1 \times 10^{15}$ cm$^{-3}$).

With this selective growth of the GaAs layer, no etching process is necessary after growth of the GaAs layer.

Figure 3D:
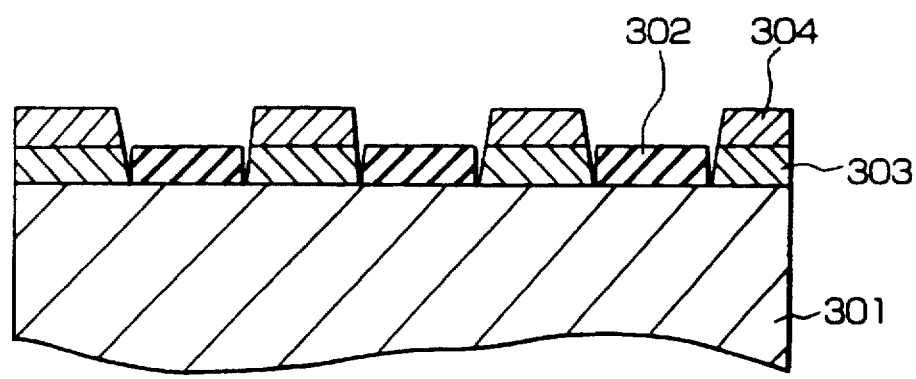

Subsequently, a GaAs film 304 is grown on the GaAs layer 303 by using the TMGa and arsine, as illustrated in FIG. 3(D) and has a P-type conductivity ($1 \times 10^{18}$ cm$^{-3}$).

According to the secondary ion mass spectrometer (SIMS) analysis, it has been found out that a concentration of carbon in the GaAs layers 303 is reduced to a concentration which is lower than a detection limit ($1 \times 10^{16}$ cm$^{-3}$) of the secondary ion mass spectrometer (SIMS).

In addition, it has been also confirmed that a density of N-type carriers of the GaAs layers 303 can be controlled within a range between $1 \times 10^{16}$ cm$^{-3}$ and $5 \times 10^{18}$ cm$^{-3}$ by adding silicon atoms to the GaAs layers 303.

Alternatively, hydrogen radicals ($1 \times 10^{-5}$ torrs) are produced by cracking hydrogen molecules by the use of a tungsten filament (1600° C.) and are irradiated onto the substrate 301. In this event, it is possible to deposit the GaAs layers 303 on the substrate 301 even when the substrate is kept at 550° C.

According to the inventors' experimental studies, it has been found out that the temperature of the selective growth can be decreased by increasing a partial pressure of the TDMAAs. For example, when the partial pressure is $5.3 \times 10^{-5}$ Torrs, the temperature of the GaAs substrate 301 may be kept at 550° C. without any irradiation of the hydrogen radicals. However, the growth rate of the GaAs layers 303 tends to be undesirably reduced with an increase of the partial pressure of TDMAAs.

A silicon nitride film or a gallium nitride film may be used in place of the silicon dioxide film for a mask of a selective growth.

Figure 4A:
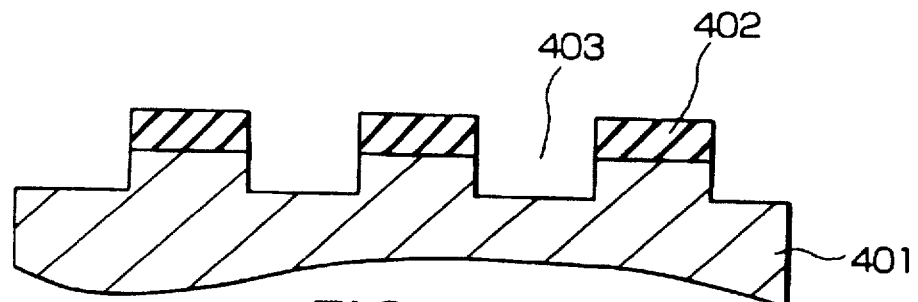
FIGS. 4(A) to (C) show similar views for use in describing steps according to a third embodiment of this invention.
Figure 4B:
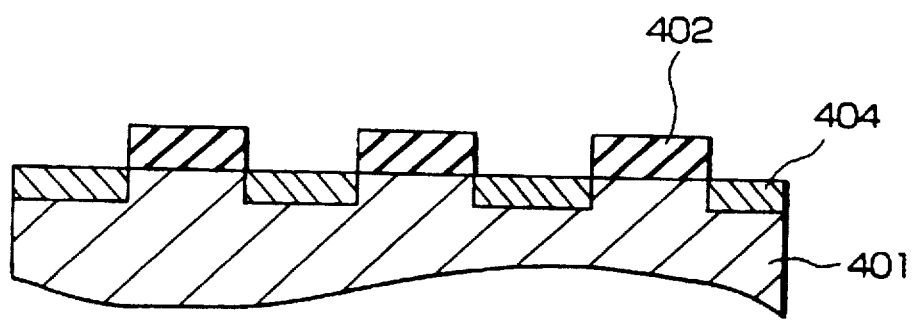
Figure 4C:
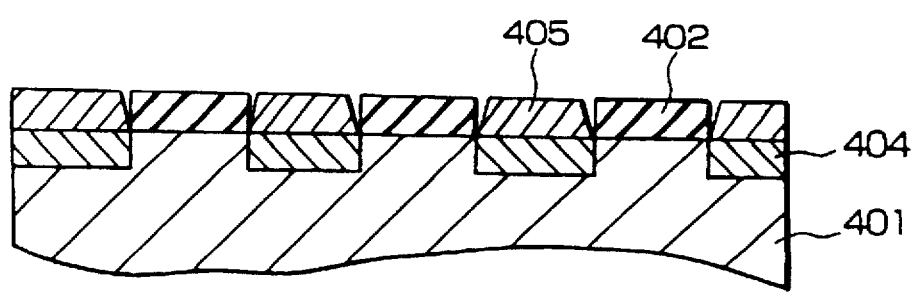

Referring to FIGS. 4(A) through (C), a method according to a third embodiment of this invention is for selectively growing a crystal of a compound semiconductor, such as GaAs, like in FIGS. 2 and 3.

At first, a gallium arsenide (001) substrate (will be simply called a substrate) 401 is prepared and is subjected to pre-processing. Specifically, a silicon dioxide film is formed on a surface of the substrate 401 by chemical vapor deposition and is 200 nm thick. The silicon dioxide film is patterned or etched by photolithography into silicon dioxide stripes 402 by the use of hydrogen fluoride. Each of the silicon dioxide stripes 402 is 1 micrometer wide and is distant by 1 micrometer from an adjoining one of the silicon dioxide stripes. In other words, a spacing between two adjacent ones of the silicon dioxide stripes is equal to 1 micrometer.

The substrate 401 and the silicon dioxide stripes 402 are cleaned or washed by an organic solvent and a sulfuric acid. Thereafter, the substrate 401 is mounted on a molecular beam epitaxy device (not shown). In this situation, TDMAAs is irradiated as an etchant onto the surfaces of the substrate 401 and the silicon dioxide stripes 402. The TDMAAs is kept at a pressure of $5.3 \times 10^{-5}$ Torrs while the substrate 401 is heated to a temperature of 600° C. This situation lasts for 1 hour.

Thus, the substrate 401 is etched on exposed surfaces of the substrate 401 to a depth of 300 nm by the TDMAAs. In other words, etching the substrate 401 is carried out by using the silicon dioxide stripes 401 as a mask. Consequently, openings 403 are formed in the substrate 401 as shown in FIG. 4(A). The substrate 401 having the openings 403 may be called a substrate member.

Then, a beam of gallium atoms is irradiated onto the GaAs substrate 401 from the Knudsen cell (not shown).

Due to irradiation of the gallium atoms, GaAs layers 404 are selectively deposited only on the GaAs substrate 401 within the openings 403 at a growth rate of 0.3 monolayer per second, as shown in FIG. 4(B). It is to be noted that no crystal growth takes place on the silicon dioxide stripes 402, like in FIGS. 2 and 3. Continuously, GaAs layers 405 are selectively deposited on the GaAs layers 404 by the use of TMG and arsine, as illustrated in FIG. 4(C). No deposition of the GaAs layers 405 is caused to occur on the silicon dioxide stripes 402.

Concentrations of impurities at boundaries between the GaAs substrate 401 and GaAs layers 404 have been measured by the SIMS and, as a result, they have been remarkably decreased by the etching of the TDMAAs. For example, it has been confirmed that a concentration of oxygen is lower than $1 \times 10^{18}$ cm$^{-3}$ and a concentration of carbon is lower than $1 \times 10^{16}$ cm$^{-3}$.

Referring to FIG. 5, a method according to a fourth embodiment of this invention is for selectively depositing a crystal of a compound semiconductor on a multilayer structure formed on a gallium arsenide (001) substrate 501 which will be simply called a substrate hereinuder.

To form the multilayer structure, an AlGaAs layer (Al composition; $\geq 0.1$) 502 of 10 nm thick is at first deposited on the substrate 501 by molecular beam epitaxy and a GaAs layer 503 of 100 nm thick is successively deposited on the AlGaAs layer 502 by the molecular beam epitaxy. The molecular beam epitaxy is carried out by the use of a molecular beam epitaxy system.

Figure 5A:
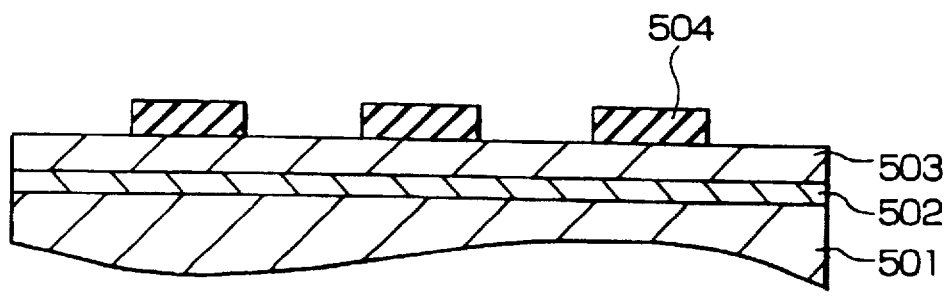
FIGS. 5(A) to (C) show similar views for use in describing steps of a method according to a fourth embodiment of this invention.

Subsequently, a silicon dioxide film of 200 nm thick is formed on a surface of the GaAs layer 502 by chemical vapor deposition. The silicon dioxide film is patterned or etched into silicon dioxide stripes 504, like in the second embodiment as shown FIG. 5(A). Thus, the substrate member is formed as illustrated in FIG. 5(A).

Figure 5B:
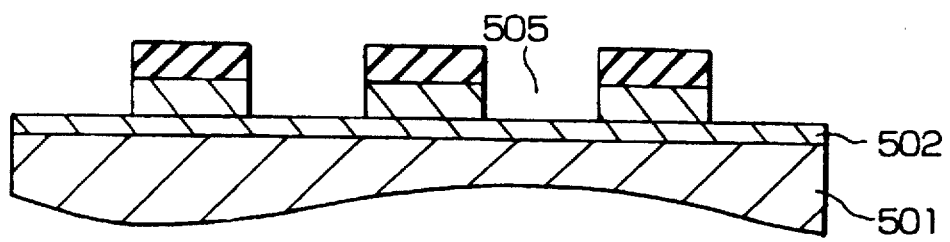

In the molecular beam epitaxy device, the TDMAAs which includes at least one amino group is irradiated as an etchant onto the surfaces of the GaAs layer 503. The TDMAAs is kept at a pressure of $5.3 \times 10^{-5}$ Torrs. Like in FIG. 4, the GaAs substrate 501 is heated to a temperature of 600° C. This situation is kept for 1 hour. The GaAs layer 503 is locally etched out at exposed surfaces by the TDMAAs. However, the AlGaAs layer 502 is not etched by the TDMAAs. Therefore, openings 505 are formed only within the GaAs layer 503, with the AlGaAs layer 502 kept unetched, as shown in FIG. 5(B).

Figure 5C:
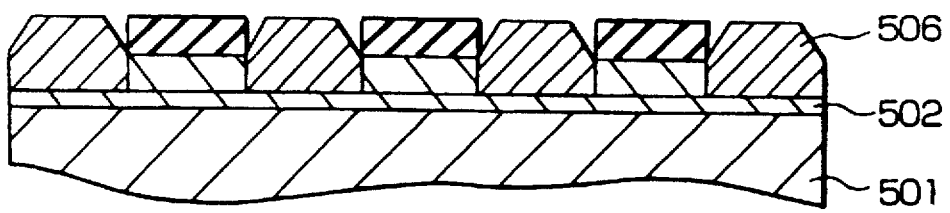

Then, a beam of gallium atoms is irradiated onto the AlGaAs layer 502 from the Knudsen cell. As a result, GaAs layers 506 are selectively deposited only on the AlGaAs layer 502 within the openings 505, as shown in FIG. 5(C).

As a result of the SIMS analysis, it has been confirmed that GaAs/AlGaAs hereto-boundaries between the AlGaAs layer 502 and GaAs layer 506 scarcely include contamination, because this process is carried out continuously in ultrahigh vacuum.

While this invention has thus far been described in conjunction with several embodiments thereof, it will readily be possible for those skilled in the art to put this invention into practice in various other manners. For example, trisdimethylaminoantimony and metallic gallium may be used for growth of a GaSb layer on a GaSb substrate. In this case, the GaSb layer has also a low concentration of impurity. In addition, the metallic compound which has at least one amino group may not be restricted to trisdimethylaminoarsine.

What is claimed is:

1. A method of selectively growing a compound semiconductor which includes first and second elements, said method comprising the steps of:

preparing a substrate member which has a first portion covered with a mask and a second portion uncovered with said mask;

preparing a metallic gallium as said first element, together with a reactive gas which includes a compound of said second element and at least one of amines bonded to said second element; and selectively depositing said compound semiconductor only on said second portion of the substrate without deposition of said compound semiconductor on said first portion, by using said reactive gas and said metallic gallium.

2. A method as claimed in claim 1, wherein said second element is arsenic.

3. A method as claimed in claim 2, wherein said compound is trisdimethylaminoarsine.

4. A method as claimed in claim 3, wherein said substrate member is composed of a gallium arsenide substrate which provides said second portion uncovered with said mask.

5. A method as claimed in claim 4, wherein the mask is formed by a selected one of silicon dioxide and nitride.

6. A method as claimed in claim 1, wherein the substrate member preparing step comprises the steps of:

preparing a substrate having a surface;

forming an insulator on said surface of the substrate;

selectively etching said insulator film to locally leave the insulator film as said mask and to provide said first and said second portions on said substrate and to thereby form said substrate member.

7. A method as claimed in claim 1, wherein the insulator film is composed of silicon dioxide.

8. A method as claimed in claim 1, wherein the substrate member preparing step comprises the steps of:

preparing a substrate having a surface;

forming an insulator film on said surface of the substrate;

selectively etching said insulator film to locally leave the insulator as said mask and to form the first portion covered with said mask and an uncovered portion with said mask;

etching the uncovered portion of the substrate to form the the second portion and to thereby provide said substrate member.

9. A method as claimed in claim 1, wherein the substrate member preparing step comprises the steps of:

preparing a substrate having a surface;

depositing a first compound semiconductor film on said surface;

depositing, on said first compound semiconductor film, a second compound semiconductor film different from said first compound semiconductor film;

selectively leaving said mask on said second compound semiconductor film with an uncovered portion of the second compound semiconductor film remaining on the first compound semiconductor film; and selectively etching said uncovered portion of the second compound semiconductor film to locally expose said first compound semiconductor film to form the second portion on the first compound semiconductor film and to thereby provide said substrate member.

10. A method as claimed in claim 9, wherein the first compound semiconductor film is composed of AlGaAs while the second compound semiconductor film is composed of GaAs.

11. A method as claimed in claim 1, further comprising the step of:

emitting hydrogen radicals onto said substrate member during the selectively depositing step.

12. A method as claimed in claim 11, wherein said emitting step comprises the steps of:
producing hydrogen molecules;
resolving said hydrogen molecules into the hydrogen radicals; and
guiding the hydrogen radicals onto said substrate member.

13. A method as claimed in claim 1, wherein said compound semiconductor is selectively deposited by a molecular beam epitaxy device.

14. A method as claimed in claim 13, wherein said metallic gallium is accommodated within a Knudsen cell of said molecular beam epitaxy device.

* * * * *